United States Patent [19]

Heuber et al.

[11] 4,319,344
[45] Mar. 9, 1982

[54] METHOD AND CIRCUIT ARRANGEMENT FOR DISCHARGING BIT LINE CAPACITANCES OF AN INTEGRATED SEMICONDUCTOR MEMORY

[75] Inventors: Klaus Heuber, Boeblingen; Siegfried K. Wiedmann, Stuttgart, both of Fed. Rep. of Germany

[73] Assignee: International Business Machines Corp., Armonk, N.Y.

[21] Appl. No.: 154,640

[22] Filed: May 30, 1980

[30] Foreign Application Priority Data

Jun. 28, 1979 [DE] Fed. Rep. of Germany ....... 2926094

[51] Int. Cl.³ ............................................. G11C 13/00
[52] U.S. Cl. .................................... 365/203; 365/154
[58] Field of Search ................................. 365/154, 203

[56] References Cited

U.S. PATENT DOCUMENTS

| | | | |
|---|---|---|---|
| 3,736,477 | 5/1973 | Berger et al. | 365/154 |
| 3,815,106 | 6/1974 | Weidmann | 365/154 |
| 3,816,758 | 6/1974 | Berger et al. | 307/214 |
| 4,044,341 | 8/1977 | Stewart | 365/203 |
| 4,077,031 | 2/1978 | Kitagawa | 365/203 |
| 4,090,255 | 5/1978 | Berger et al. | 365/154 |
| 4,110,840 | 8/1978 | Abe et al. | 365/203 |

OTHER PUBLICATIONS

IEEE Journal of Solid State Circuits, vol. SC/7, No. 5, Oct. 1972, pp. 340–346.

*Primary Examiner*—Terrell W. Fears
*Attorney, Agent, or Firm*—Stephen J. Limanek

[57] ABSTRACT

A method and arrangement is provided for selecting and discharging a pair of bit lines of a plurality of charged pairs of bit lines of a memory circuit having cells of the merged transistor logic type. A selected pair of bit lines is discharged through a selected cell coupled to the selected pair of bit lines while simultaneously the remaining or non-selected pairs of bit lines are discharged through a common switch into non-selected word lines.

9 Claims, 9 Drawing Figures

METHOD AND CIRCUIT ARRANGEMENT FOR DISCHARGING BIT LINE CAPACITANCES OF AN INTEGRATED SEMICONDUCTOR MEMORY

TECHNICAL FIELD

The invention relates to a method for discharging bit line capacitances of an integrated semiconductor memory and to a circuit arrangement for applying this method.

BACKGROUND ART

A method and circuit arrangement are known, such as described in commonly assigned U.S. Pat. No. 4,090,255, filed by H. H. Berger et al on Mar. 1, 1976, for operating an integrated semiconductor storage system whose storage cells include flip-flop circuits with bipolar transistors and Schottky diodes as read/write coupling elements. These cells use as load elements highly resistive resistors or transistors controlled as current sources, and whose write/read cycles are performed in several phases, and which are selected by voltage level changes to word lines and bit lines, and which for increasing the writing speed and the reading speed, and for decreasing the power dissipation, effect the discharge of the bit lines via the conductive memory cell transistors. The bit lines are discharged to ground via these conductive memory cell transistors. During the read phase of the memory, the bit lines are charged only slightly so that the charge current flowing through the memory cell is very low.

In recent years, there has been considerable activity in the development of logic circuits and of an integrated semiconductor memory technique with bipolar transistors. These developments have become known in the trade literature as merged transistor logic (MTL) or integrated injection logic ($I^2L$). Reference is made to articles published in *IEEE Journal of Solid State Circuits*, Vol. SC/7, No. 5, Oct. 1972, pages 340 to 346. Similar suggestions were also made in commonly assigned U.S. Pat. Nos. 3,736,477, filed Apr. 14, 1971, and 3,816,758, filed Mar. 15, 1973, by H. H. Berger and S. K. Wiedmann.

These concepts covering bipolar transistors are characterized by short switching times and are particularly suitable for designing extremely highly integrated memories and logic circuit arrays.

In commonly assigned U.S. Pat. No. 3,815,106, filed May 11, 1972, by S. K. Wiedmann, another memory is described which includes two logic circuits and where the collector of the inverting transistor of the one circuit is respectively coupled to the base of the inverting transistor of the other circuit. The two transistors are of inverse operation and form the actual flip-flop transistors. As a load element for both flip-flop transistors, a complementary transistor is connected via a specific line to each base circuit through which minority load carriers are injected, i.e. current is supplied. For addressing, i.e., for writing and reading of the memory cell, the base of each flip-flop transistor is additionally connected to the emitter of an associated additional complementary addressing transistor whose collector is applied to an associated bit line and whose base is applied to an address line.

Commonly assigned U.S. patent application Ser. No. 763,183, entitled "Highly Integrated Inverting Circuit" by S. K. Wiedmann, filed Jan. 27, 1977, now abandoned, discloses a highly integrated inverting logic circuit with a zone sequence forming an inverting transistor which is supplied with power by charge carrier injection via an injection region or injector close to the base-emitter junction and controlled on the base, which is characterized in that to the injection region a sensing circuit is connected via which the conductive state of the inverting transistor is sensed as a function of the current reinjected into the injection region when the transistor is conductive.

Memories with cells having a structure of the MTL type described in application Ser. No. 763,183 require for the selection of a cell the recharging of bit data and/or word line capacitances. The voltage swing of the bit lines corresponds approximately to the voltage swing of the selected word lines.

As mentioned hereinabove in connection with U.S. Pat. No. 4,090,255, the capacitive discharge currents are discharged to ground via the memory cells of the selected word line and via the word line driver. However, with a large number of memory cells in a matrix there is the disadvantage that the surface requirement of the driver circuits, the electric power dissipation for each driver, and the delay times in the selection of the word line are so excessive that the advantages normally obtained by the use of the MTL structure would be of little or no value.

Commonly assigned U.S. patent application Ser. No. 101,366, filed on Dec. 7, 1979 by S. K. Wiedmann, describes a method of controlling a semiconductor memory and a circuit arrangement which does not exhibit these disadvantages. This method is characterized in that in time before the selection for the storage matrix by a selection signal control logic, known per se, simultaneously applies control signals to a discharge circuit common to all memory cells, and to switching transistors which are then switched on, that, consequently, on the bit data and control lines the discharge currents of the line capacitances flow through the switching transistors, and jointly flow off via the discharge circuit. This circuit arrangement is characterized in that the bit lines within the memory matrix are connected to a discharge line which in turn is connected to a discharge circuit, and that the discharge circuit and all word and/or bit line switches are connected for their control via lines to control logic which is connected to the selection signal of the memory chip. Although with this discharge method, as well as with the circuit arrangement for carrying out that method, it is possible to use the minimum swing on the word line, to prevent capacitive peak currents on the voltage supply lines, and to have a relatively high integration, this solution has some disadvantages. The discharge operation and the selection operation of the bit lines have to take place successively. The rise of the sense current from the sensing circuit following the bit line selection decisively determines the access time of the storage cell. The bit and word line switching transistors operating in parallel all have to be switched on so that the restore time of the memory chip is extended by the time required for this step.

DISCLOSURE OF INVENTION

It is an object of this invention to provide an improved method for discharging bit lines of a memory array on a semiconductor chip.

It is another object of this invention to provide an improved method for discharging bit lines of bipolar transistor memory cells, particularly of the merged transistor logic (MTL) or integrated injection logic ($I^2L$) type.

It is still another object of this invention to provide an improved method for selecting and discharging memory cell bit lines which eliminates successive execution of selection and discharge operations.

It is yet another object of this invention to provide an improved method and arrangement for selecting and discharging bit lines of memory cells which avoids capacitive peak currents over the word lines of the cells.

It is a further object of this invention to provide an improved method and arrangement for selecting and discharging bit lines of memory cells which avoids the simultaneous switching off of bit and word line circuits at the end of the selection time.

In accordance with the teachings of this invention, a selection discharge system is provided for a memory having short access/cycle time in the nanosecond range, and with very low power dissipation in the milliwatt range with no high peak current on the selected word lines upon discharge. Also, the discharge of the bit line capacitances is performed in parallel with the selection of the word line, and the selected bit line pair is discharged toward the word line by the selected memory cell. The times for the selection operation and for the discharge operation do not add up but merely overlap, providing an accelerated read/write operation, which means that there is an increase in operating speed, i.e., a faster access of the memory. Furthermore, the voltage swing of the bit line discharge is determined only by a residual voltage controlled discharge switch. For the selection of a memory cell within the memory array, only the bit line switching transistors are switched off in a decoded manner that are connected to the selected bit line pair. The bit line switch transistors which are connected to the non-selected bit line pairs remain conductive during the selection phase. Equally, only that word line switching transistor is switched off on the word side which is connected to the selected word line. By using decoded switching of the discharge transistors with the associated word and bit decoder circuits, it is possible to decode the discharge transistors with a minimum of circuit complexity.

The foregoing and other objects, features and advantages of the invention will be apparent from the following and more particular description of the preferred embodiment of the invention, as illustrated in the accompanying drawings.

BEST MODE FOR CARRYING OUT THE INVENTION

Figure 1:
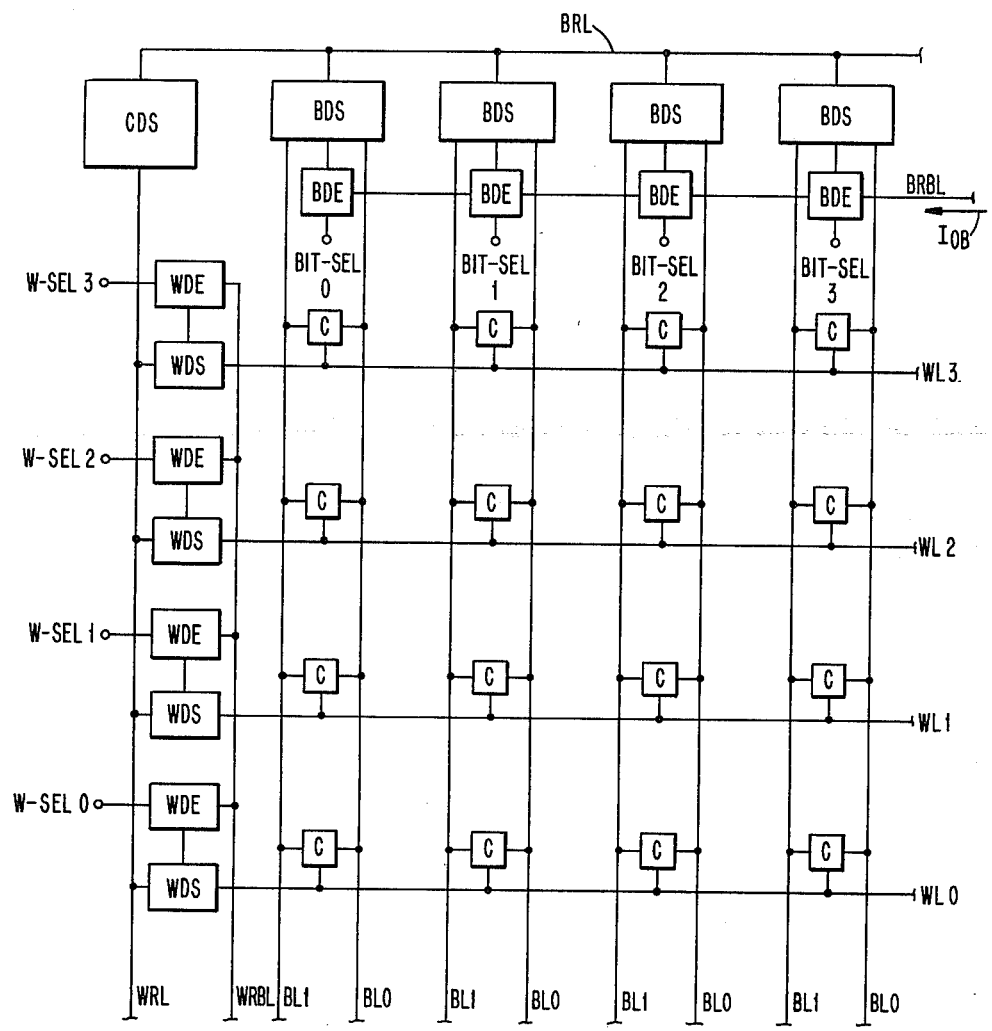
FIG. 1 is a circuit shown primarily in block form indicating the standby state of the memory array of the present invention.
Figure 1A:
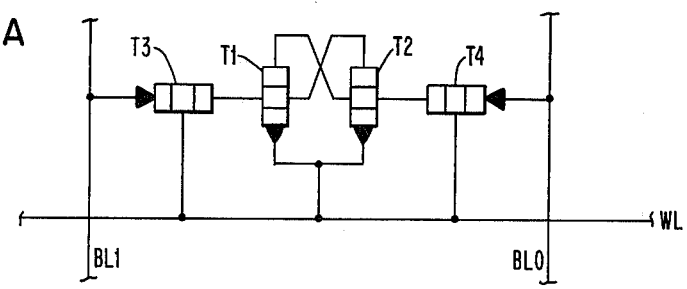
FIG. 1A is a memory cell of the merged transistor logic type that can be used in the memory array of FIG. 1.

The memory circuit or system of the present invention shown in FIG. 1 includes memory cells C, preferably of the MTL or $I^2L$ type, located at the intersection of word lines WL0, WL1, WL2 and WL3 and bit line pairs BL1, BL0. A cell circuit of the MTL type is illustrated in FIG. 1A of the drawing with NPN transistors T1 and T2 being inverting transistors and with PNP transistors T3 and T4 serving as injectors. Each bit line pair BL1, BL0 to which all memory cells C within a column of the memory are coupled is connected to a bit discharge switch BDS which in turn is selected via an associated bit decoupling element BDE having an input terminal to which a bit selection signal BIT-SEL 0, 1, 2 or 3 is applied, and having a current $I_{OB}$ applied thereto via a bit reference base line BRBL. Furthermore, all bit discharge switches BDS within the memory circuit are connected to a common bit reference line BRL leading to a common discharge switch CDS. Another input of the common discharge switch CDS is connected to a word reference line WRL. Between each word line WL0, WL1, WL2 and WL3 and the word reference line WRL there is provided a word discharge switch WDS.

Each of the word discharge switches WDS is connected to an associated word decoupling element WDE having an input terminal to which a word selection signal W-SEL 0, 1, 2 or 3 is applied.

Before the various phases of the selection and discharge operation are explained in detail with reference to the circuit shown in FIG. 1, the basic features of the present selection and discharge method will be described.

For discharging the existing capacitances (not shown) on bit lines BL1 and BL0, the selection method uses the bit discharge switches BDS which from bit lines BL0 and BL1 are switched to a bit reference line BRL, and then to word discharge switches WDS connected to a common word reference line WRL.

The discharge current of bit lines BL1 and BL0 flows via bit and word discharge switches BDS and WDS and via common discharge switch CDS arranged between the bit reference line BRL and the word reference line WRL. The voltage swing of the bit discharge line is determined by the residual voltage controlled common bit discharge switch CDS.

For the selection of a particular cell C of the memory circuit, only those bit discharge switches BDS are switched off in a decoded manner which are connected to the respectively selected bit line pair. The bit discharge switches BDS which are connected to non-selected bit line pairs remain conductive during the selection phase. In a memory with, e.g., 128 bit line pairs, where one bit line pair is selected, this means that only that bit discharge switch BDS for one bit line pair BL1, BL0 is switched off in a decoded manner, where reading takes place, whereas the remaining bit discharge switches BDS for the other 127 bit line pairs BL1, BL0 remain conductive during the selection phase.

In regard to word line selection, only that word discharge switch WDS is switched off which is connected to the selected word line. The discharge switches connected to the non-selected word lines remain conductive, i.e. that with, e.g., 128 existing word lines, the word discharge switches for 127 non-selected word lines remain conductive.

With associated word and bit decoder circuits, this decoder switching of the discharge switches permits a minimum amount of additional circuit components and rapid and simple decoding of the discharge switches.

Figure 2:
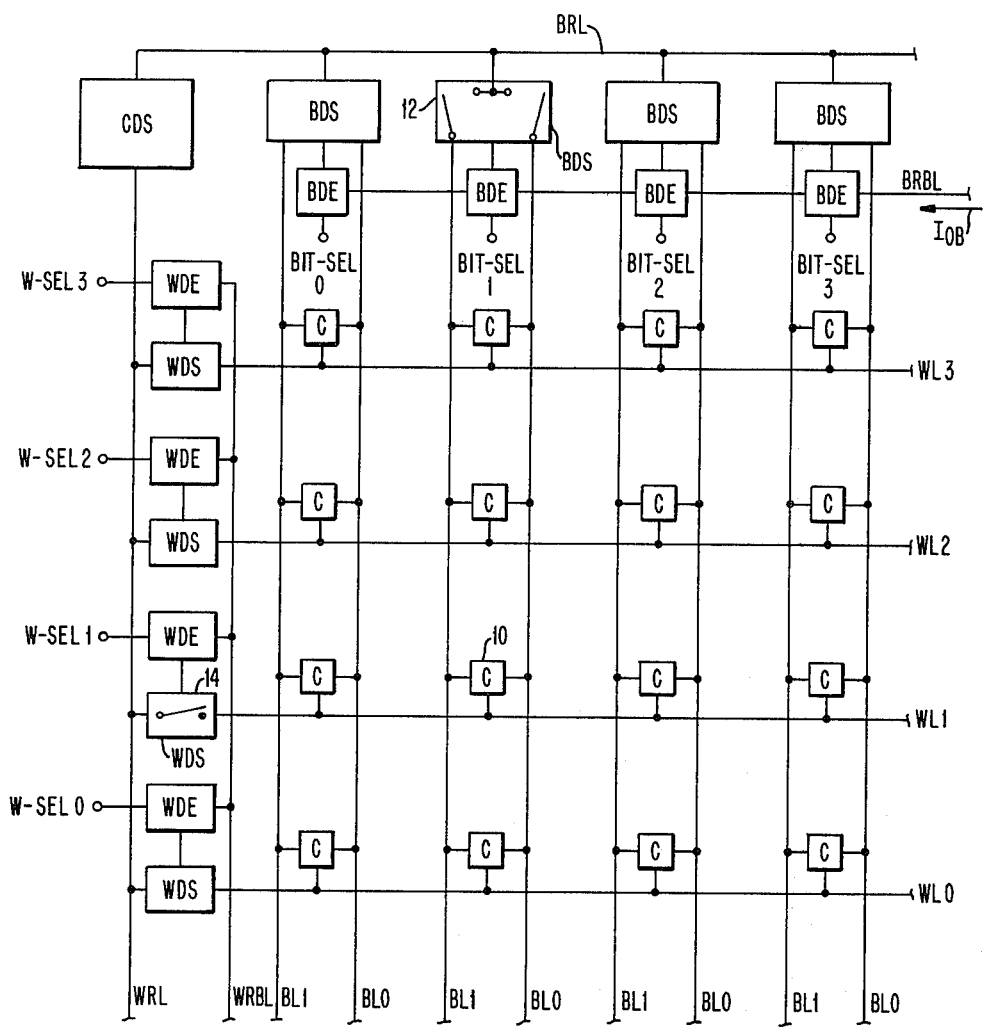
FIG. 2 is a circuit similar to that of FIG. 1 indicating the condition of the array upon the application of predetermined word and bit selection signals.

Within the memory circuit of FIG. 2, the memory cell C identified as 10 is selected through the application of a signal on word line WL1 and through the application of a bit selection signal BIT-SEL 1 to the input terminal of the respective bit decoupling element BDE coupled to bit discharge switch 12. It is pointed out here that in the standby state only standby current flows through memory cells C. As shown in the memory circuit of FIG. 2, the bit and word discharge switches BDS and WDS, identified as 12 and 14, respectively, are opened or decoupled from the respective bit and word reference lines BRL and WRL through the application of the bit selection signal BIT-SEL 1 and the word selection signal W-SEL 1. To illustrate this arrangement, the word discharge switch 14 of word line WL1, as well as bit discharge switch 12 of the bit line pair BL1, BL0 associated with the BIT-SEL 1 terminal, are shown schematically as associated open switches, which however, in an actual circuit are preferably in the form of transistors.

Figure 3:
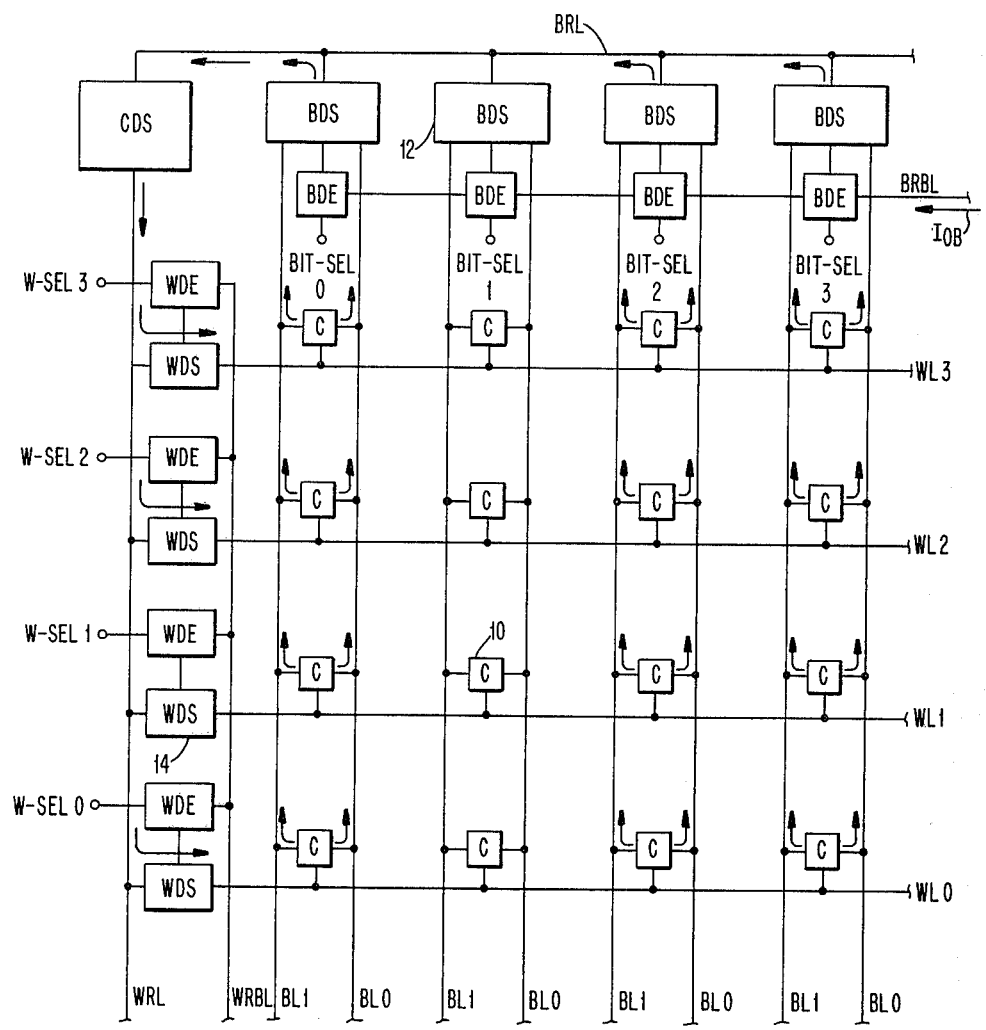
FIG. 3 is a circuit similar to that of FIG. 2 indicating activated discharge switches discharging non-selected bit lines.

As indicated in FIG. 3 all injector capacitances of the memory cells not associated with the selected bit line pair BL1, BL0 are discharged via the common bit reference line BRL, with common discharge switch CDS being activated, as shown schematically by the arrows in non-selected bit line pairs BL1, BL0 and at the output of the bit discharge switches BDS.

The discharge current now flows via common discharge switch CDS to the common word reference line WRL and through word discharge switches WDS that have not been switched off, into the respective word lines, i.e., WL0, WL2 and WL3, as indicated by the respective arrows in FIG. 3.

Figure 4:
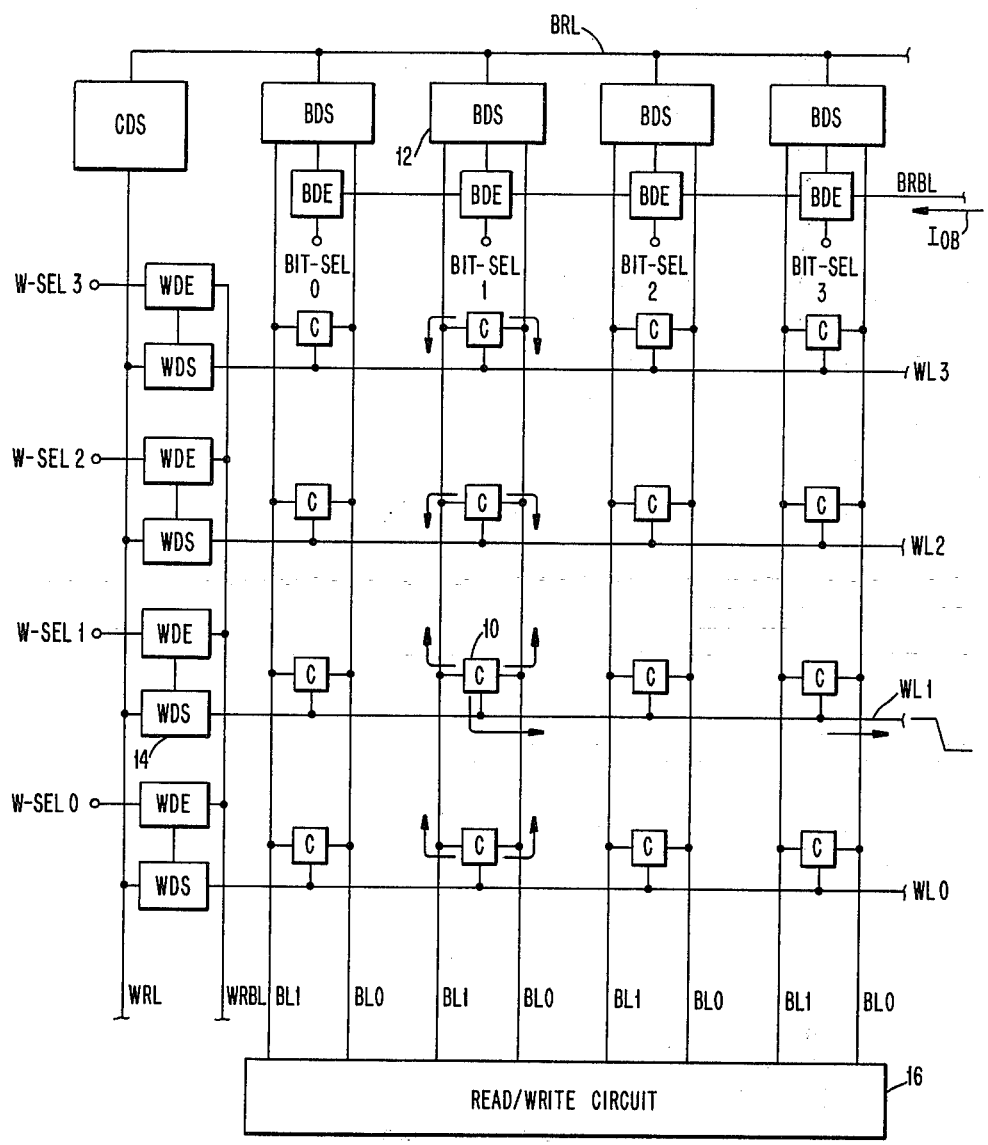
FIG. 4 is a circuit similar to that of FIG. 3 indicating discharge in selected bit lines.

As shown in FIG. 4, the injector capacitances of the memory cells C associated with the selected bit line pair BL1, BL0 discharge during selection of word line WL1 by lowering the potential on word line WL1, as indicated in FIG. 4, via the selected memory cell 10, as indicated by arrows on bit line pair BL1, BL0 controlled by BIT-SEL 1 signal and on word line WL1. It is again to be noted that the discharge of the non-selected bit lines BL1, BL0, as indicated in FIG. 3, and the discharge of the selected bit line BL1, BL0, as indicated in FIG. 4, occur simultaneously.

Due to the capacitive current from the selected bit line pair BL1, BL0, the selected memory cell values rise very quickly to the levels required for reading or writing so that a high sensing current for the memory cell becomes available rapidly, in spite of a slowly rising DC sensing current from read/write circuit 16.

Figure 5:
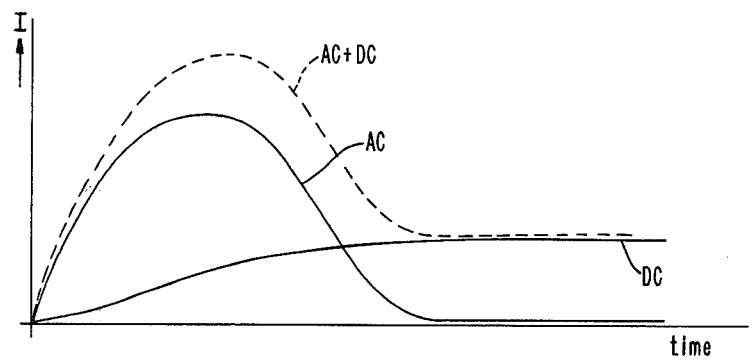
FIG. 5 is a time diagram of the sense current for the selected memory cell of the memory circuit indicated in FIGS. 1 to 4.

The addition of the sensing current from the read/write circuit 16 to the capacitive sensing current is shown by the current diagram of FIG. 5. It indicates that the DC sensing current supplied by the write/read circuit 16 rises only slowly after bit selection by the BIT-SEL signal since the DC sensing current may be generated by lateral PNP transistors. On the other hand, the discharge of the bit line capacitances causes the flow of an AC capacitive current through the coupling PNP transistors of the MTL-type memory cell C, the AC capacitive current being added to the DC sensing current supplied by the write/read circuit 16, i.e. it supports that current so that the entire sense current AC and DC is obtained through the addition of the rising direct current and of the capacitive discharge current. The result is a considerable improvement of the read/write speed of the memory circuit without any additional electric power dissipation. Apart from the shorter access time, the time conditions for the individual control signals within the memory are rendered less complicated since the bit line capacitance discharge takes place simultaneously with the word selection and does not have to be terminated before word selection. Since, furthermore, only one of n word discharge switches has to be switched off and on again in a selection, only two of n bit line switching transistors need be switched off and on again in a selection. Consequently there is a reduction of switching time and electric power dissipation so that the additionally required power dissipation for the decoding of the switching transistors is at least compensated.

Whereas the capacitive sense current is determinable by the dynamic operation, the value of the bit line capacitances and the voltage swing on the lines, the current supplied by a read/write amplifier is adjustable separately via the read/write circuit 16 depending on the memory cell used and on its design.

Figure 6:
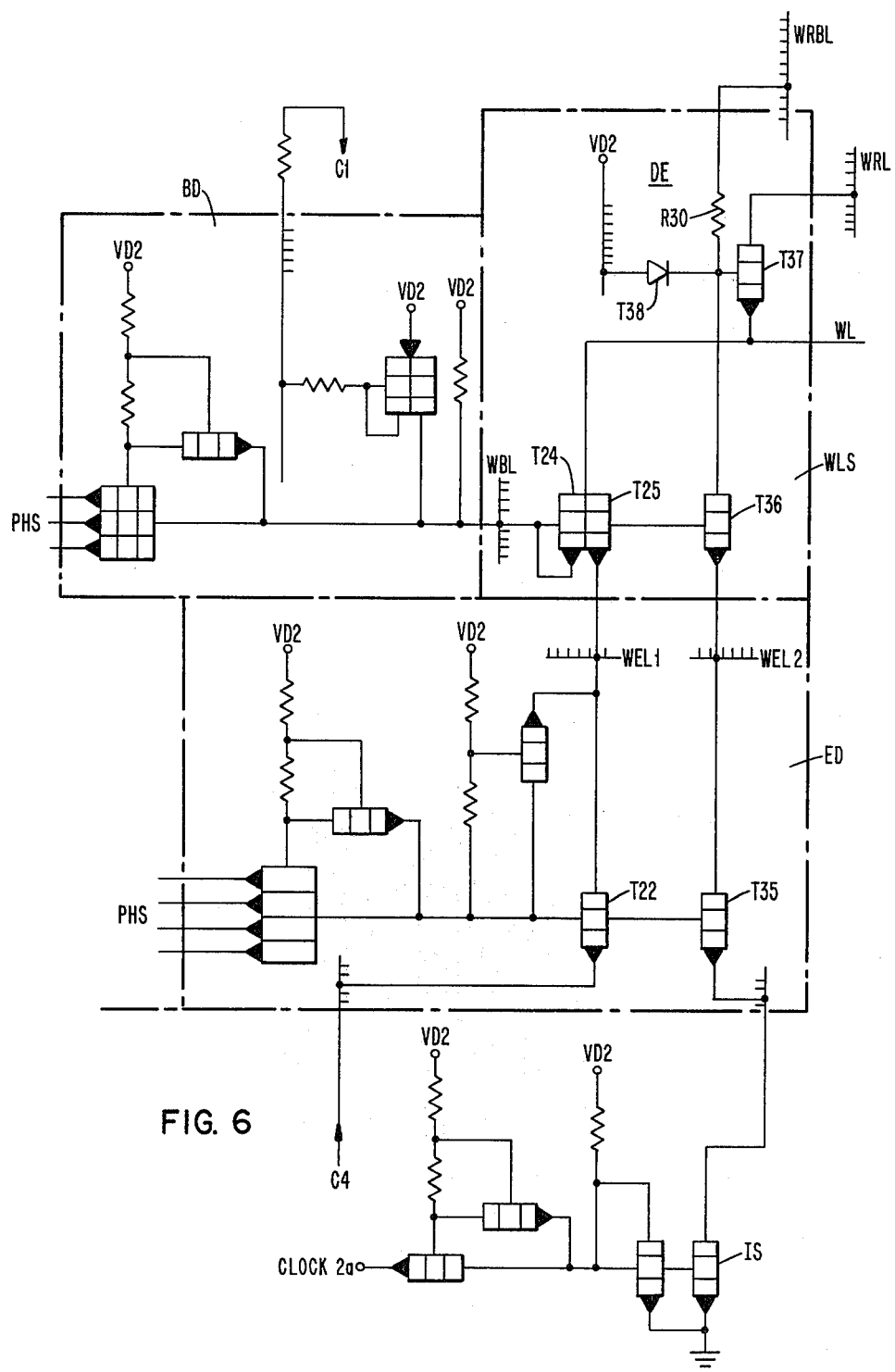
FIG. 6 is a circuit for selecting and decoupling a word line.

Any known circuit arrangement may be used to select a word line and additionally to prepare doing so a select signal for a word line switching transistor, such as transistor T37, is shown in the circuit of FIG. 6 of the drawing. Delayed selection of word line driver transistors T24 and T25 is also handled by this circuit. A clock generator, shown only in part in the lower portion of FIG. 6, controls the execution with respect to time of the switching operations of the memory circuit. Clock pulses are applied to a phase splitter indicated at PHS (not shown) that is arranged in series with the base and emitter decoders BD and ED. The base decoder BD has output lines WBL and the emitter decoder ED has output lines WEL1 and WEL2. Another clock pulse controls the bit selection providing signals BIT-SEL 1, 2, 3 and 4 as indicated in FIGS. 1 to 4 of the drawing.

Figure 8:
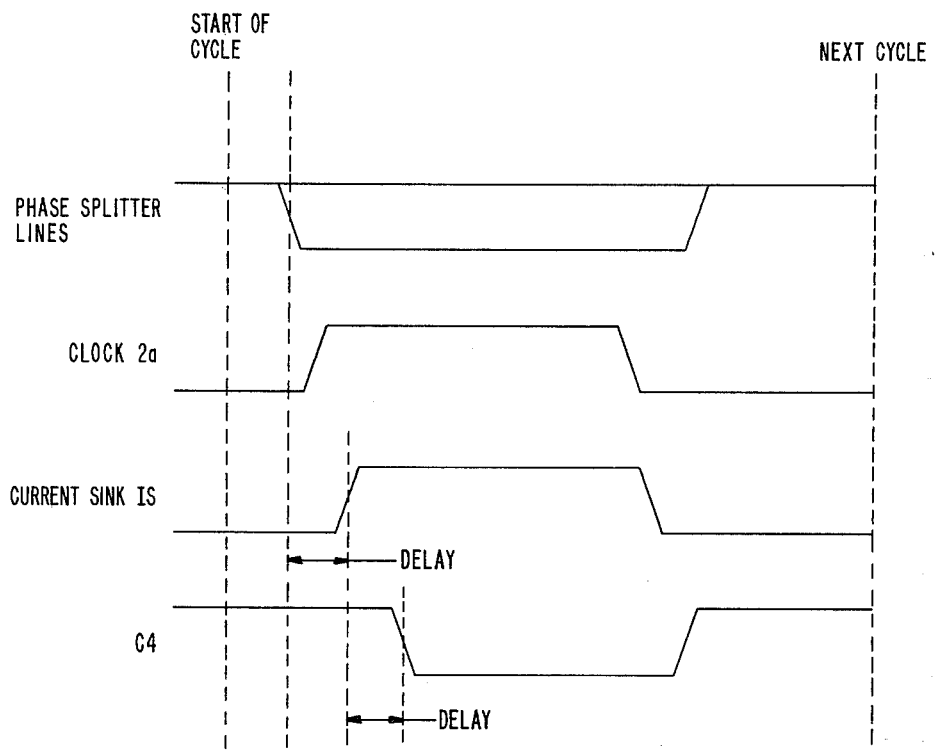
FIG. 8 is a pulse program which may be used to operate the circuit of FIG. 6 of the drawings.

The output signals of the phase splitters which are applied to the inputs of the base and of the emitter decoders BD and ED are in their true state. Subsequently, current sink IS is switched on for discharge into the bit line by clock 2a, as indicated in FIG. 8 of the drawings, and then transistor T35 in selected emitter decoder ED is conductive, and, via the selected base decoder BD, one of the n transistors T36 is switched on.

The base potential of the selected transistor T37, which functions as the word discharge switch WDS in FIGS. 1–4, is lowered and transistor T37 is thus nonconductive. The other transistors T37 are decoupled by resistor R30. Current source IS in the clock generator has to be designed in such a manner that a residual current is supplied via clamping diode T38 indicated in box WLS of FIG. 6.

Word line WL to be selected is decoupled from word reference line WRL when transistor T37 is non-conductive. Through a clock pulse, such as C4, transistor T22 in the selected emitter decoder ED is switched on, and via the selected base decoder BD, word line driver transistors T24, T25 belonging to the same word line WL are switched on so that the word line WL, on standby potential, is discharged to the selection potential.

Figure 7:
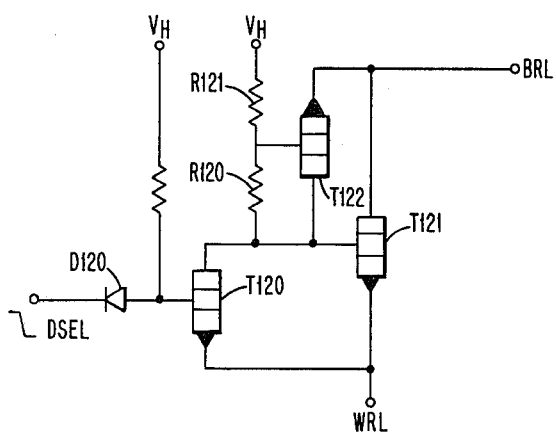
FIG. 7 is a circuit of the word discharge switch in the circuit of FIGS. 1 to 4.

Common discharge switch CDS is shown in detail in FIG. 7. This discharge switch CDS includes a driver transistor T121 and a clamping transistor T122, so that via the resistance ratio of resistors R120 and R121 the residual voltage for the transient discharge state is set. It should be noted that full discharge of the residual transistor voltage on transistor T121 is not required, for this would only increase the charge that is moved during the discharge process. Transistor T120 and diode D120 in the circuit of FIG. 7 are selected by the discharge selection signal DSEL and in turn control discharge transistor T121.

Any known suitable read/write circuits or amplifiers can be used in the memory circuit. Since these circuits are not the subject of the invention no detailed circuits have been illustrated. Furthermore, the operation of the invention is not influenced appreciably by the read/write circuit.

It is of course equally possible to use decoder circuits other than those illustrated in the drawings without departing from the principle of the present invention.

While the invention has been particularly shown and described with reference to a preferred embodiment thereof, it will be understood by those skilled in the art that various changes in form and details may be made therein without departing from the spirit and scope of the invention.

What is claimed is:

1. A memory system comprising;
   a given plurality of cells,
   a plurality of bit lines, each having a first plurality of cells of said given plurality of cells coupled thereto,
   a common discharge switch,
   means for selecting one cell of a first plurality of cells coupled to a given bit line,
   accessing means for supplying during a given time period a first current to said one cell,
   means for supplying to said one cell during said given time period a discharge current from said given bit line, and
   means for discharging said plurality of bit lines, except said given bit line, through said common discharge switch during said given time period.

2. A memory system as set forth in claim 1 further including a plurality of word lines, one word line of said plurality of word lines being coupled to said one cell and means for adjusting the voltage on said one word line to draw said first current and said given bit line discharge current through said one cell to said one word line during said given time period.

3. A memory system comprising;
   a plurality of pairs of bit lines,
   a plurality of word lines arranged to intersect with said bit lines,
   a plurality of merged transistor logic type cells coupled to each pair of said bit lines and to said word lines at the intersections of said bit and word lines,
   read/write circuit means coupled to said bit lines,
   a common discharge switch having first and second terminals,
   a plurality of bit discharge switches coupled between said pairs of bit lines and the first terminal of said common discharge switch,
   a plurality of word discharge switches coupled between said plurality of word lines and the second terminal of said common discharge switch,
   a plurality of decoupling elements, a respective one of said decoupling elements being coupled to said bit and word discharge switches, and
   means for applying signals to said decoupling elements to isolate a given pair of bit lines from the first terminal of said common discharge switch and to isolate a given word line from the second terminal of said common discharge switch.

4. A memory system as set forth in claim 3 further including means for varying the voltage on said given word line.

5. A memory system comprising;
   a given plurality of cells,
   a plurality of bit lines, each having a first plurality of cells of said given plurality of cells coupled thereto,
   a plurality of word lines,
   means for selecting one cell of a first plurality of cells coupled to a given bit line of said plurality of bit lines and to a given word line of said plurality of word lines,
   means for supplying through said one cell to said given word line during a given time period a discharge current from said given bit line,
   a discharge switch, and
   means for supplying through said discharge switch to the remaining word lines of said plurality of word lines during said given time period a discharge current from the remaining bit lines of said plurality of bit lines.

6. A method for selecting and discharging a given bit line of a plurality of charged bit lines of a memory circuit having cells coupled thereto and to a plurality of word lines which includes;
   discharging said given bit line to a given word line of said plurality of word lines through a given cell coupled to said given bit line, and
   simultaneously discharging to the remaining word lines the remaining bit lines through a discharge circuit coupled to said remaining bit lines.

7. A method as set forth in claim 6 wherein each of said cells is of the merged transistor logic type and further including supplying a current from read/write circuit means to said given cell while discharging said bit lines.

8. A memory system comprising;
   a given plurality of cells,
   a plurality of bit lines, each having a first plurality of cells of said given plurality of cells coupled thereto,
   means for selecting one cell of a first plurality of cells coupled to a given bit line,
   a plurality of word lines, one word line of said plurality of word lines being coupled to said one cell,
   accessing means for supplying during a given time period a first current to said one cell,
   means for supplying to said one cell during said given time period a discharge current from said given bit line,
   means for adjusting the voltage on said one word line to draw said currents through said one cell to said word line,
   a common discharge switch, and
   means for discharging said plurality of bit lines, except said given bit line, through said common discharge switch during said given time period.

9. A memory system as set forth in claim 8 wherein said discharging means discharges said plurality of bit lines into said plurality of word lines.

* * * * *